(12) United States Patent
Peng et al.

(10) Patent No.: US 12,518,969 B2
(45) Date of Patent: Jan. 6, 2026

(54) SEMICONDUCTOR STRUCTURE HAVING RELIABLE LINE PATTERN DESIGNS AND METHOD OF MANUFACTURING THE SAME

(71) Applicant: TAIWAN SEMICONDUCTOR MANUFACTURING COMPANY LTD., Hsinchu (TW)

(72) Inventors: Liang-Shiuan Peng, Taipei (TW); Chih-Hung Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 737 days.

(21) Appl. No.: 17/811,080

(22) Filed: Jul. 7, 2022

(65) Prior Publication Data

US 2024/0014037 A1    Jan. 11, 2024

(51) Int. Cl.
*H01L 21/027* (2006.01)
(52) U.S. Cl.
CPC ................. *H01L 21/0274* (2013.01)
(58) Field of Classification Search
CPC .......... H01L 21/0274; H01L 21/0334
USPC .......................................... 257/231
See application file for complete search history.

(56) References Cited

U.S. PATENT DOCUMENTS

| 2006/0083996 A1* | 4/2006 | Kim ..................... G03F 7/70566 |
| | | 430/30 |
| 2014/0011364 A1* | 1/2014 | Sipani ................. H01L 21/0338 |
| | | 257/E21.249 |

* cited by examiner

*Primary Examiner* — Quoc D Hoang
(74) *Attorney, Agent, or Firm* — WPAT LAW; Anthony King

(57) ABSTRACT

The present disclosure provides a semiconductor structure and a method of manufacturing a semiconductor structure. The semiconductor structure includes a first set of photoresist structures, a second photoresist structure, and a third photoresist structure. The first set of photoresist structures is disposed along a first orientation. The second photoresist structure is disposed non-parallel to the first orientation. The third photoresist structure is disposed non-parallel to the first orientation. The second photoresist structure and the third photoresist structure contact at least one of the first set of photoresist structures.

20 Claims, 16 Drawing Sheets

SEMICONDUCTOR STRUCTURE HAVING RELIABLE LINE PATTERN DESIGNS AND METHOD OF MANUFACTURING THE SAME

BACKGROUND

The present invention relates generally to semiconductor structures, and more particularly to semiconductor structures having reliable line pattern designs and methods of manufacturing the same.

When manufacturing a photoresist structure, if too long, the structure can easily collapse or overlap adjacent photoresist structures, negatively affecting reliability. Accordingly, means of strengthening the photoresist structure are critical in preventing photoresist collapse during manufacture.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
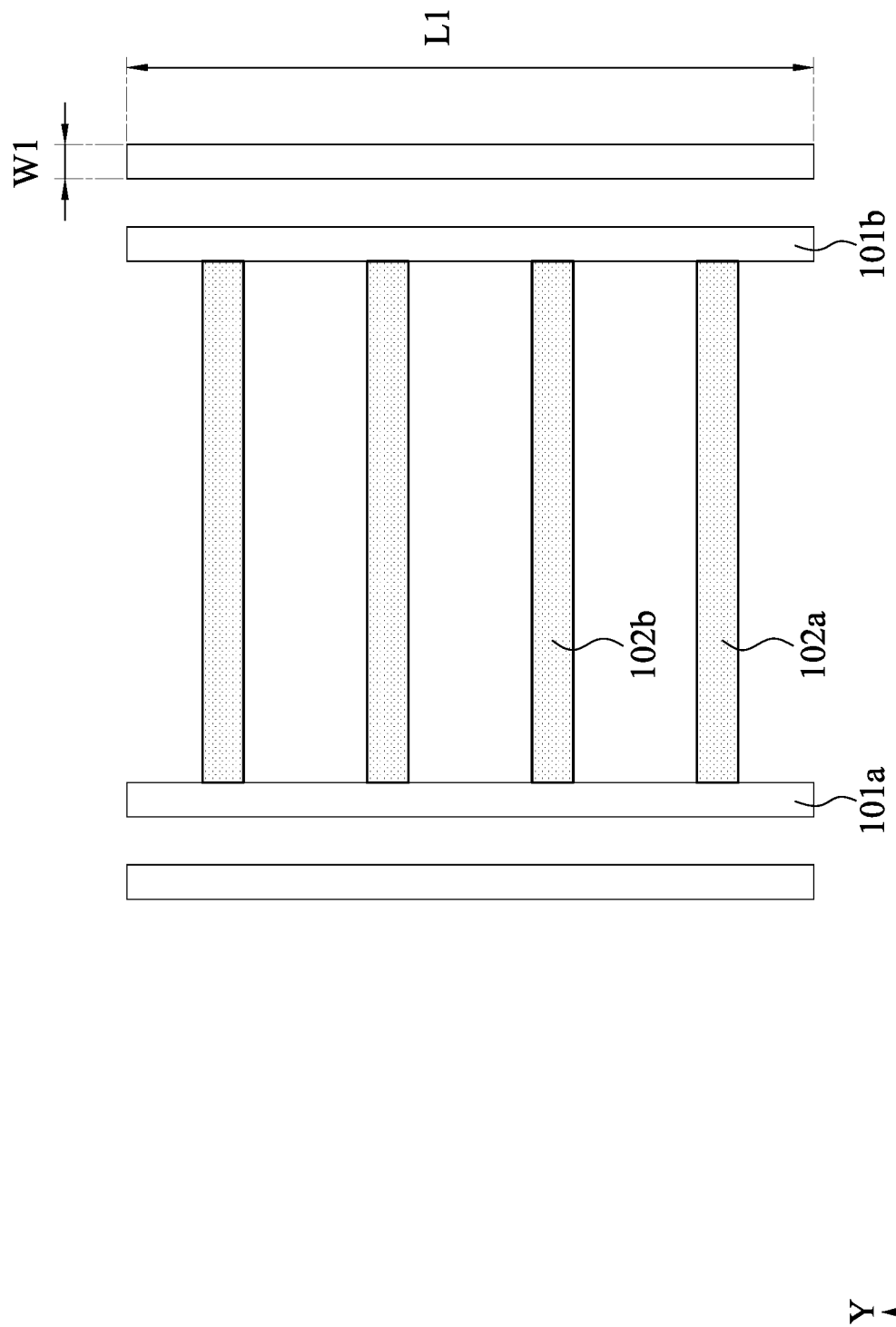
FIG. 1 illustrates an exemplary top view of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

When manufacturing photoresist structures, a dummy pattern may be used to balance distribution of the structures. During manufacture, if too long, the structure can easily collapse or overlap adjacent photoresist structures, negatively affecting reliability. The present disclosure proposes several uses of dummy patterns for improving reliability of the photoresist structures.

FIG. 1 illustrates an exemplary top view of a semiconductor structure, in accordance with some embodiments of the present disclosure. A set of photoresist structures 101a and 101b is disposed along a Y-axis (vertical). Photoresist structures 101a and 101b are spaced apart. Each of the set of photoresist structures 101a and 101b has a width W1 and a length L1. In some embodiments, the ratio of L1/W1 exceeds 500.

A photoresist structure 102a is disposed along an X-axis (horizontal). The photoresist structure 102a is disposed non-parallel to the Y-axis. The photoresist structure 102a is disposed orthogonal to the Y-axis. Another photoresist structure 102b is disposed along the X-axis. The photoresist structure 102b is disposed non-parallel to the Y-axis. The photoresist structure 102b is disposed orthogonal to the Y-axis. The photoresist structure 102a is disposed between the set of photoresist structures 101a and 101b. The photoresist structure 102b is disposed between the set of photoresist structures 101a and 101b. The photoresist structure 102a contacts the photoresist structure 101a. The photoresist structure 102a contacts the photoresist structure 101b. The photoresist structure 102b contacts the photoresist structure 101a. The photoresist structure 102b contacts the photoresist structure 101b.

The set of photoresist structures 101a and 101b is disposed at opposite ends of the photoresist structure 102a. The set of photoresist structures 101a and 101b is disposed at opposite ends of the photoresist structure 102b. The photoresist structures 102a and 102b are spaced apart. A length of the photoresist structure 102a is substantially the same as that of the photoresist structure 102b. A width of the photoresist structure 102a is substantially the same as that of the photoresist structure 102b. The photoresist structures 102a and 102b form a fence profile between the set of photoresist structures 101a and 101b.

The photoresist structures 101a, 101b, 102a, and 102b may include a positive photoresist or a negative photoresist. In some embodiments, the photoresist structures 101a, 101b, 102a, and 102b may include phenol-formaldehyde or novolac resin. In some embodiments, the photoresist structures 101a, 101b, 102a, and 102b may include polyisoprene.

When manufacturing photoresist structures 101a and 101b, dummy photoresist structures 102a and 102b may be needed to balance distribution between the photoresist structures 101a and 101b. During manufacture, if the photoresist structures 101a and 101b are too long, they can easily experience collapse or overlap, decreasing reliability of the semiconductor structure. The dummy photoresist structures 102 and 102b can prevent the photoresist structures 101a and 101b from overlapping, and thus improve reliability of photoresist structures 101a and 101b.

Figure 2:
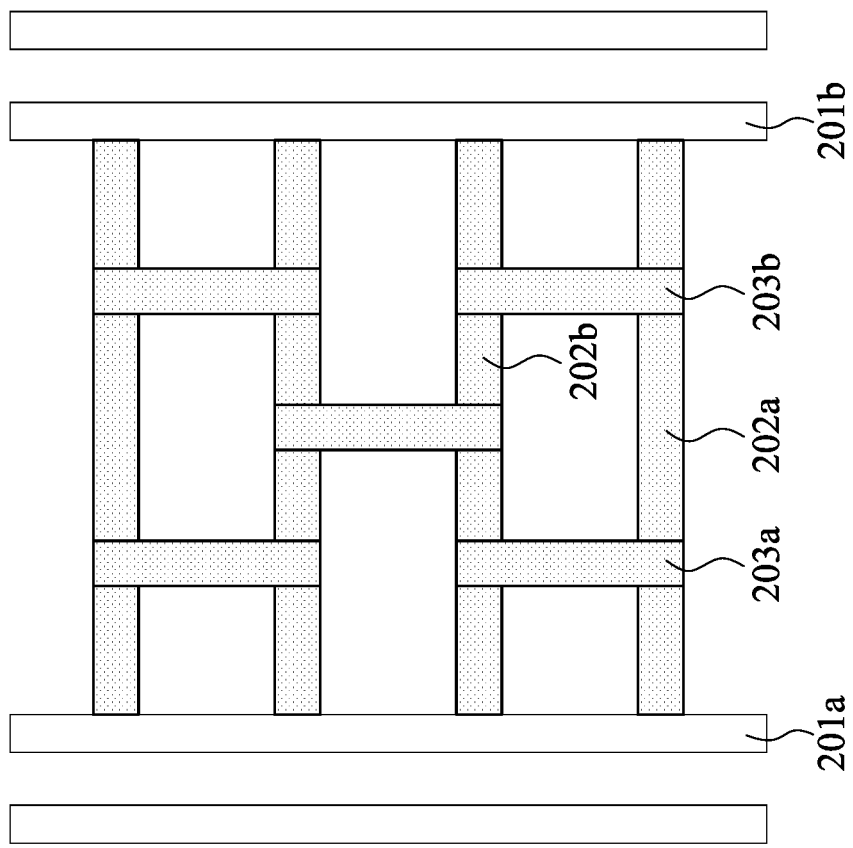
FIG. 2 illustrates an exemplary top view of a semiconductor structure, in accordance with some embodiments of the present disclosure.

FIG. 2 illustrates an exemplary top view of a semiconductor structure, in accordance with some embodiments of the present disclosure. The difference between FIG. 2 and FIG. 1 is that FIG. 2 further includes photoresist structures 203a and 203b. The photoresist structures 203a and 203b are disposed along a Y-axis. The photoresist structures 203a and 203b are formed between the photoresist structures 202a and 202b. The photoresist structures 203a and 203b contact the photoresist structure 202a. The photoresist structures 203a and 203b contact the photoresist structure 202b. The photoresist structures 202a and 202b are disposed at opposite ends of the photoresist structure 203a. The photoresist structures 202a and 202b are disposed at opposite ends of the photoresist structure 203b.

Referring to FIG. 2, one or more rectangular regions can be specified between the photoresist structures 201a and 201b. In some embodiments, a rectangular region can be specified by the photoresist structures 202a, 202b, 203a, and 203b. In some embodiments, a rectangular region can be specified by the photoresist structures 202a, 202b, 203b, and 201b.

Figure 3:
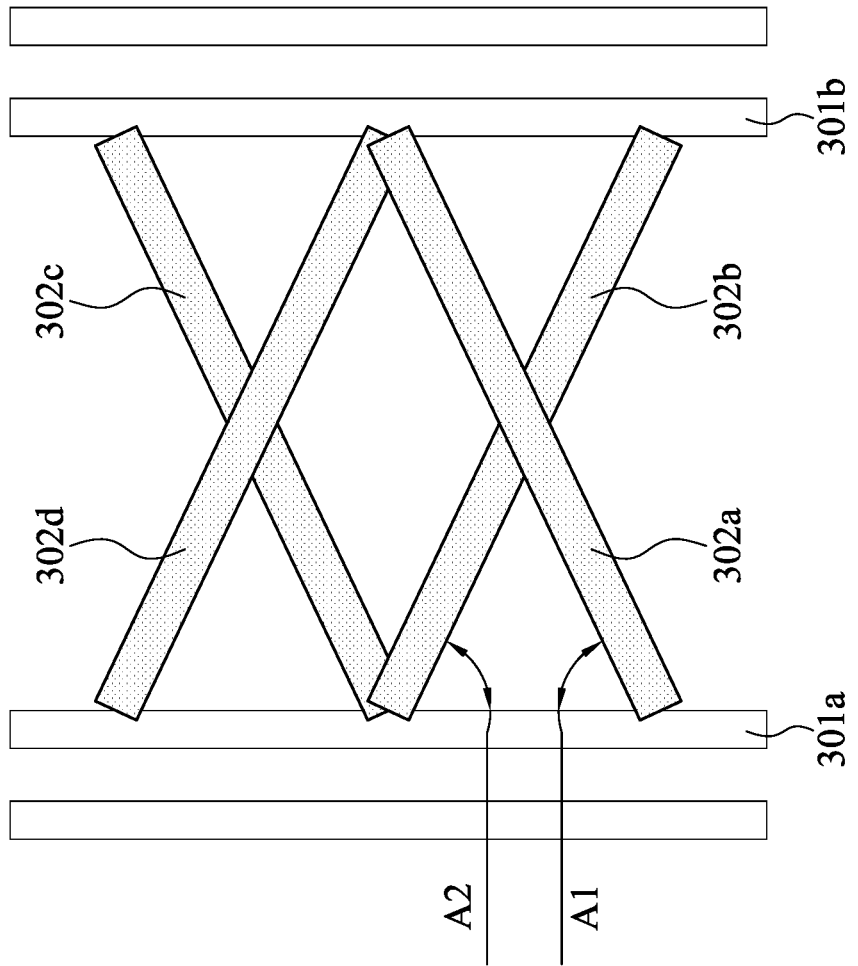
FIG. 3 illustrates an exemplary top view of a semiconductor structure, in accordance with some embodiments of the present disclosure.

FIG. 3 illustrates an exemplary top view of a semiconductor structure, in accordance with some embodiments of the present disclosure. A set of photoresist structures 301a and 301b are disposed along a Y-axis. The photoresist structures 301a and 301b are spaced apart.

A photoresist structure 302a is disposed non-parallel to the Y-axis. Another photoresist structure 302b is disposed along another orientation non-parallel to the Y-axis. The photoresist structure 302a is disposed in a manner different from the photoresist structure 302b. The photoresist structure 302a is disposed between the set of photoresist structures 301a and 301b. The photoresist structures 302b is disposed between the set of photoresist structures 301a and 301b. The photoresist structure 302a contacts the photoresist structure 301a. The photoresist structure 302a contacts the photoresist structure 301b. The photoresist structure 302b contacts the photoresist structures 301a. The photoresist structure 302b contacts the photoresist structure 301b.

The photoresist structures 302a and 302b intersect. An angle A1 between the photoresist structures 301a and 302a is acute. The angle A1 between the photoresist structures 301a and 302a is less than 90°. An angle A2 between the photoresist structures 301a and 302b is acute. The angle A2 between the photoresist structures 301a and 302b is less than 90°. From the top view of the semiconductor structure in FIG. 3, the photoresist structures 302a and 302b are arranged in an X-configuration Referring to FIG. 3, one or more triangular regions can be specified between the photoresist structures 301a and 301b. In some embodiments, a triangular region can be specified by the photoresist structures 301a, 302a, and 302b. One or more rectangular regions can be specified between the photoresist structures 301a and 301b. In some embodiments, a rectangular region can be specified by the photoresist structures 302a, 302b, 302c, and 302d.

Figure 4:
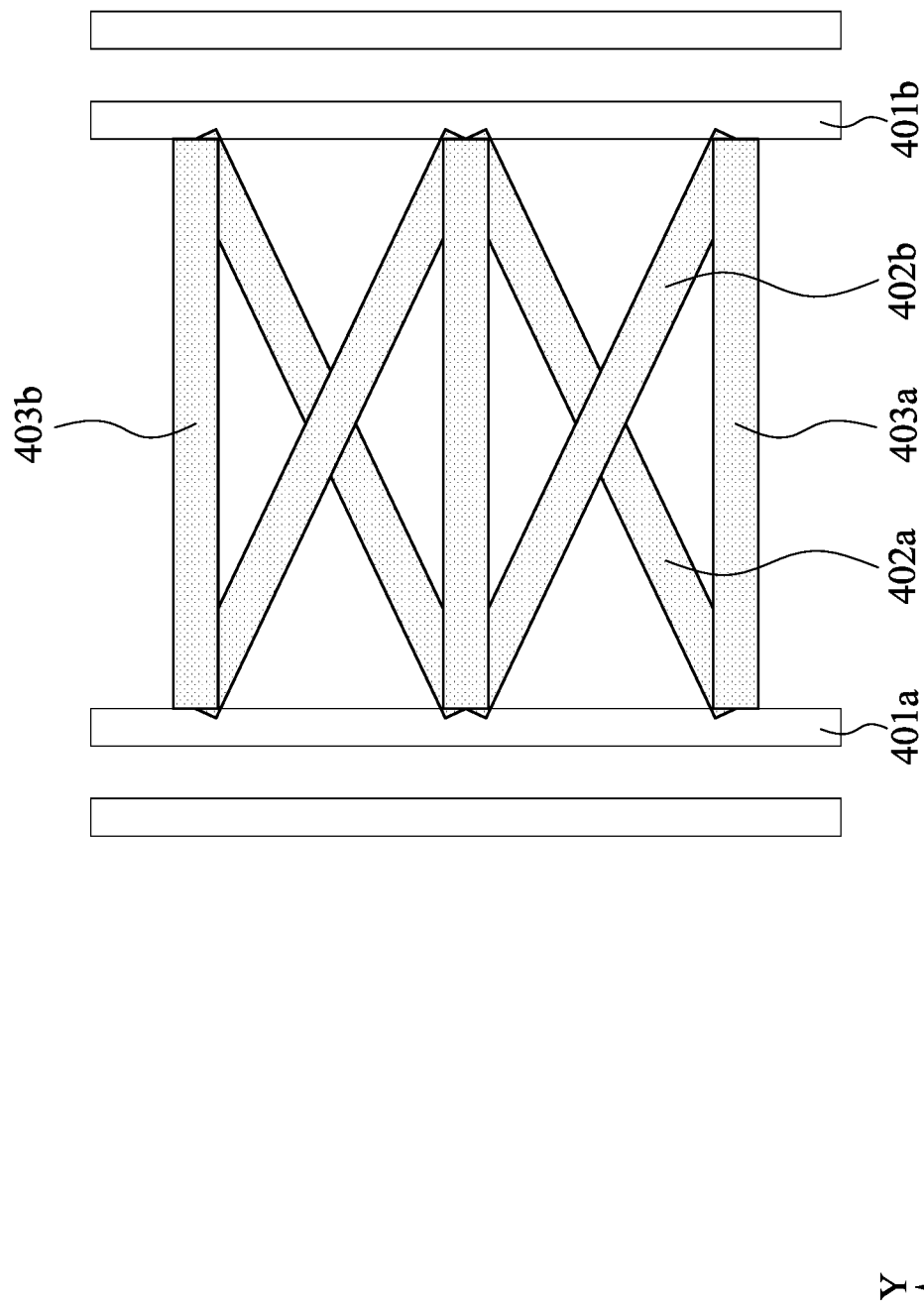
FIG. 4 illustrates an exemplary top view of a semiconductor structure, in accordance with some embodiments of the present disclosure.

FIG. 4 illustrates an exemplary top view of a semiconductor structure, in accordance with some embodiments of the present disclosure. The difference between FIG. 4 and FIG. 3 is that FIG. 4 further includes photoresist structures 403a and 403b. The photoresist structures 403a and 403b are disposed along an X-axis. The photoresist structures 403a and 403b are disposed orthogonal to the Y-axis. The photoresist structures 403a and 403b contact the photoresist structure 401a. The photoresist structures 403a and 403b contact the photoresist structure 401b. The photoresist structures 403a and 403b contact the photoresist structure 402a. The photoresist structures 403a and 403b contact the photoresist structure 402b. A length of the photoresist structure 403a is substantially the same as that of the photoresist structure 403b. A width of the photoresist structure 403a is substantially the same as that of the photoresist structure 403b.

Referring to FIG. 4, one or more triangular regions can be specified between the photoresist structures 401a and 401b. In some embodiments, a triangular region can be specified by the photoresist structures 401a, 402a, and 402b.

Figure 5:
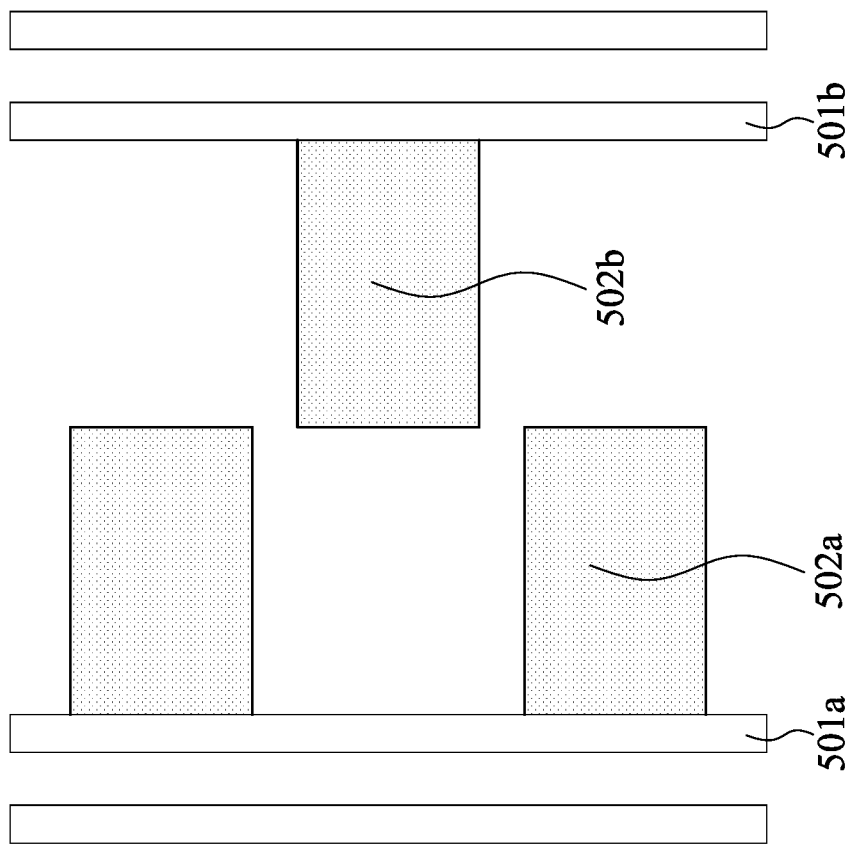
FIG. 5 illustrates an exemplary top view of a semiconductor structure, in accordance with some embodiments of the present disclosure.

FIG. 5 illustrates an exemplary top view of a semiconductor structure, in accordance with some embodiments of the present disclosure. A set of photoresist structures 501a and 501b are disposed along a Y-axis. The photoresist structures 501a and 501b are spaced apart.

A photoresist structure 502a is disposed between the set of photoresist structures 501a and 501b. A photoresist structure 502b is disposed between the set of photoresist structures 501a and 501b. The photoresist structure 502a contacts the photoresist structures 501a. The photoresist structure 502a is spaced apart from the photoresist structure 501b. The photoresist structure 502b contacts the photoresist structure 501b. The photoresist structure 502b is spaced apart from the photoresist structure 501a.

A length of the photoresist structure 502a is substantially the same as that of the photoresist structure 502b. A width of the photoresist structure 502a is substantially the same as that of the photoresist structure 502b. The photoresist structure 502a is spaced apart from the photoresist structure 502b. The photoresist structures 502a and 502b are alternatively arranged between the set of photoresist structures 501a and 501b.

The photoresist structures 502a and 502b can each include a square profile. The width of the photoresist structure 502a can be substantially identical to the length thereof. The width of the photoresist structure 502b can be substantially identical to the length thereof. The width of the photoresist structure 502a can exceed the width of the photoresist structure 501a. The width of the photoresist structure 502b can exceed the width of the photoresist structure 501b.

Figure 6:
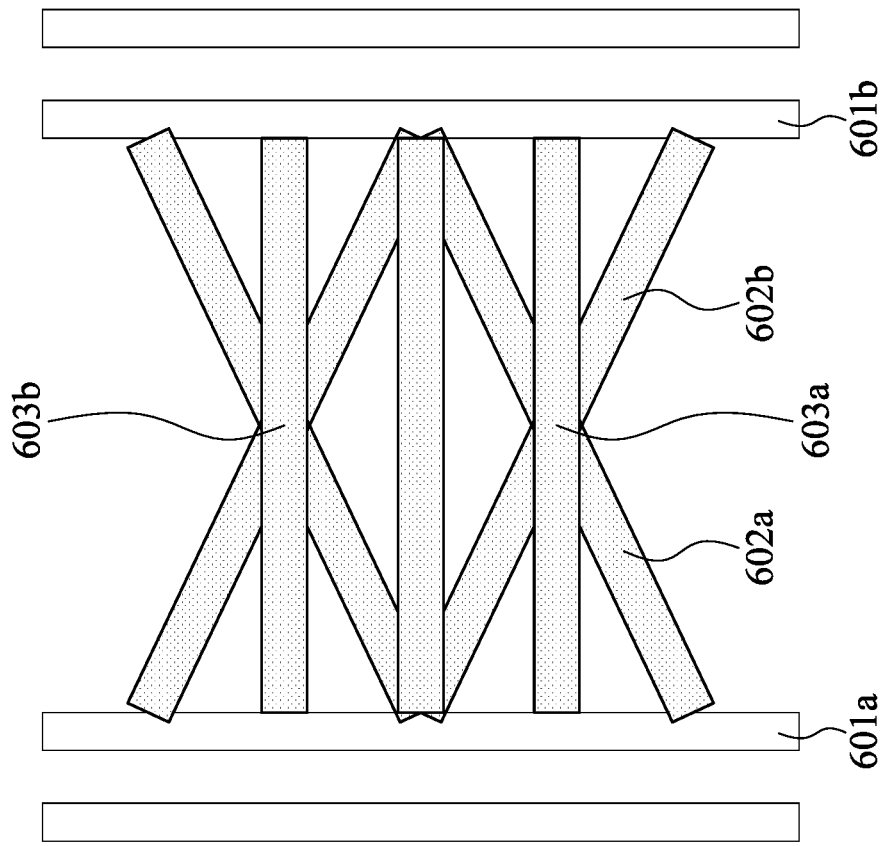
FIG. 6 illustrates an exemplary top view of a semiconductor structure, in accordance with some embodiments of the present disclosure.

FIG. 6 illustrates an exemplary top view of a semiconductor structure, in accordance with some embodiments of the present disclosure. A set of photoresist structures 601a and 601b are disposed along a Y-axis. The photoresist structures 601a and 601b are spaced apart.

The difference between FIG. 6 and FIG. 4 is that FIG. 6 further includes photoresist structures 603a and 603b, disposed at an intersection of the other photoresist structures. For example, the photoresist structure 603a can be disposed at the intersection of the photoresist structures 602a and 602b. The photoresist structure 603 contacts the photoresist structures 602a and 602b concurrently. A length of the photoresist structure 603a is substantially the same as that of the photoresist structure 603b. A width of the photoresist structure 603a is substantially the same as that of the photoresist structure 603b.

Referring to FIG. 6, one or more triangular regions can be specified between the photoresist structures 601a and 601b. The triangular regions specified by the photoresist structures between the photoresist structures 601a and 601b can be of different sizes.

Figure 7:
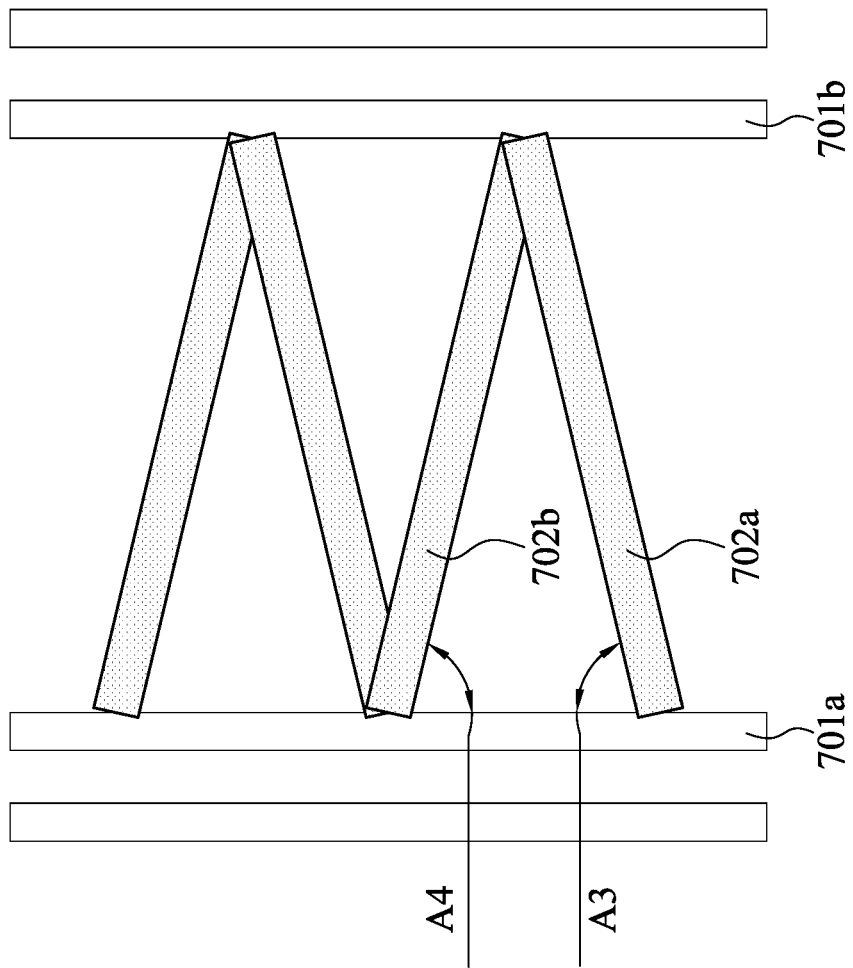
FIG. 7 illustrates an exemplary top view of a semiconductor structure, in accordance with some embodiments of the present disclosure.

FIG. 7 illustrates an exemplary top view of a semiconductor structure, in accordance with some embodiments of the present disclosure. A set of photoresist structures 701a and 701b are disposed along a Y-axis. The photoresist structures 701a and 701b are spaced apart.

A photoresist structure 702a is disposed non-parallel to the Y-axis. The photoresist structure 702a is disposed non-parallel to an X-axis. Another photoresist structure 702b is disposed non-parallel to the Y-axis. The photoresist structure 702b is disposed non-parallel to the X-axis. The photoresist structure 702a is disposed differently from that of the photoresist structure 702b. The photoresist structure 702a is disposed between the set of photoresist structures 701a and 701b. The photoresist structure 702b is disposed between the set of photoresist structures 701a and 701b. The photoresist structure 702a contacts the photoresist structure 701a. The photoresist structure 702a contacts the photoresist structure 701b. The photoresist structure 702b contacts the photoresist structure 701a. The photoresist structure 702b contacts the photoresist structure 701b. The photoresist structures 702a and 702b contact each other.

The photoresist structures 702a and 702b intersect. An angle A3 between the photoresist structures 701a and 702a is acute. The angle A3 between the photoresist structures 701a and 702a is less than 90°. An angle A4 between the photoresist structures 701a and 702b is acute. The angle A4 between the photoresist structures 701a and 702b is less than 90°. From the top view of the semiconductor structure in FIG. 7, the photoresist structures 702a and 702b are arranged in a zigzag shape. From the top view of the semiconductor structure in FIG. 7, the photoresist structures 702a and 702b are arranged in a W-configuration.

Figure 8:
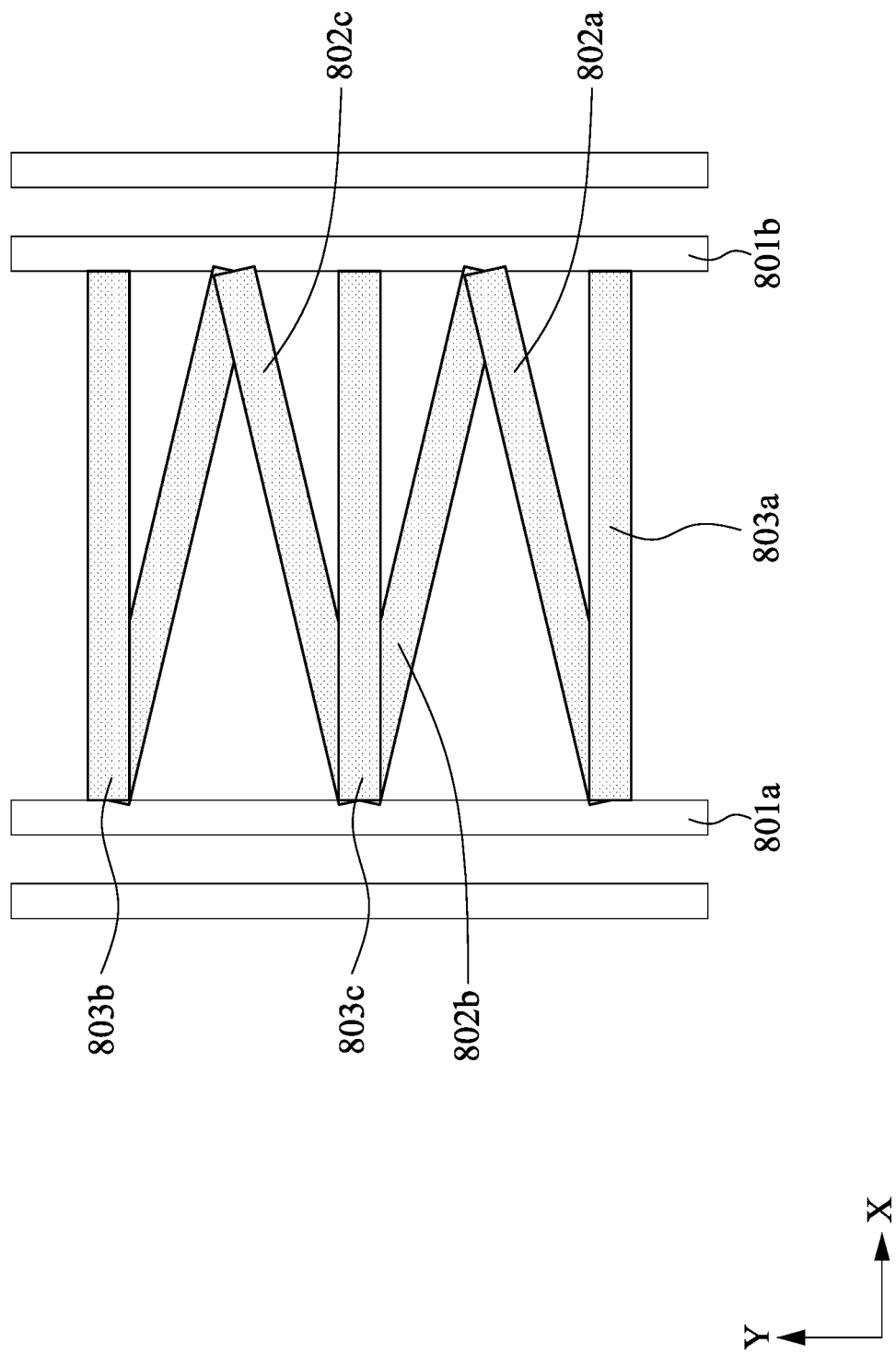
FIG. 8 illustrates an exemplary top view of a semiconductor structure, in accordance with some embodiments of the present disclosure.

FIG. 8 illustrates an exemplary top view of a semiconductor structure, in accordance with some embodiments of the present disclosure. The difference between FIG. 8 and FIG. 7 is that FIG. 8 further includes photoresist structures 803a, 803b and 803c. The photoresist structures 803a, 803b and 803c are disposed in the X-axis. The photoresist structures 803a, 803b and 803c are disposed orthogonal to the Y-axis. The photoresist structures 803a, 803b and 803c contact the photoresist structure 801a. The photoresist structures 803a, 803b and 803c contact the photoresist structure 801b. The photoresist structure 803c contacts the photoresist structures 802b and 802c. A length of the photoresist structure 803a is substantially the same as that of the photoresist structure 803b. A width of the photoresist structure 803a is substantially the same as that of the photoresist structure 803b.

Referring to FIG. 8, one or more triangular regions can be specified between the photoresist structures 801a and 801b. The triangular regions specified by the photoresist structures between the photoresist structures 801a and 801b can be different sizes.

Figure 9:
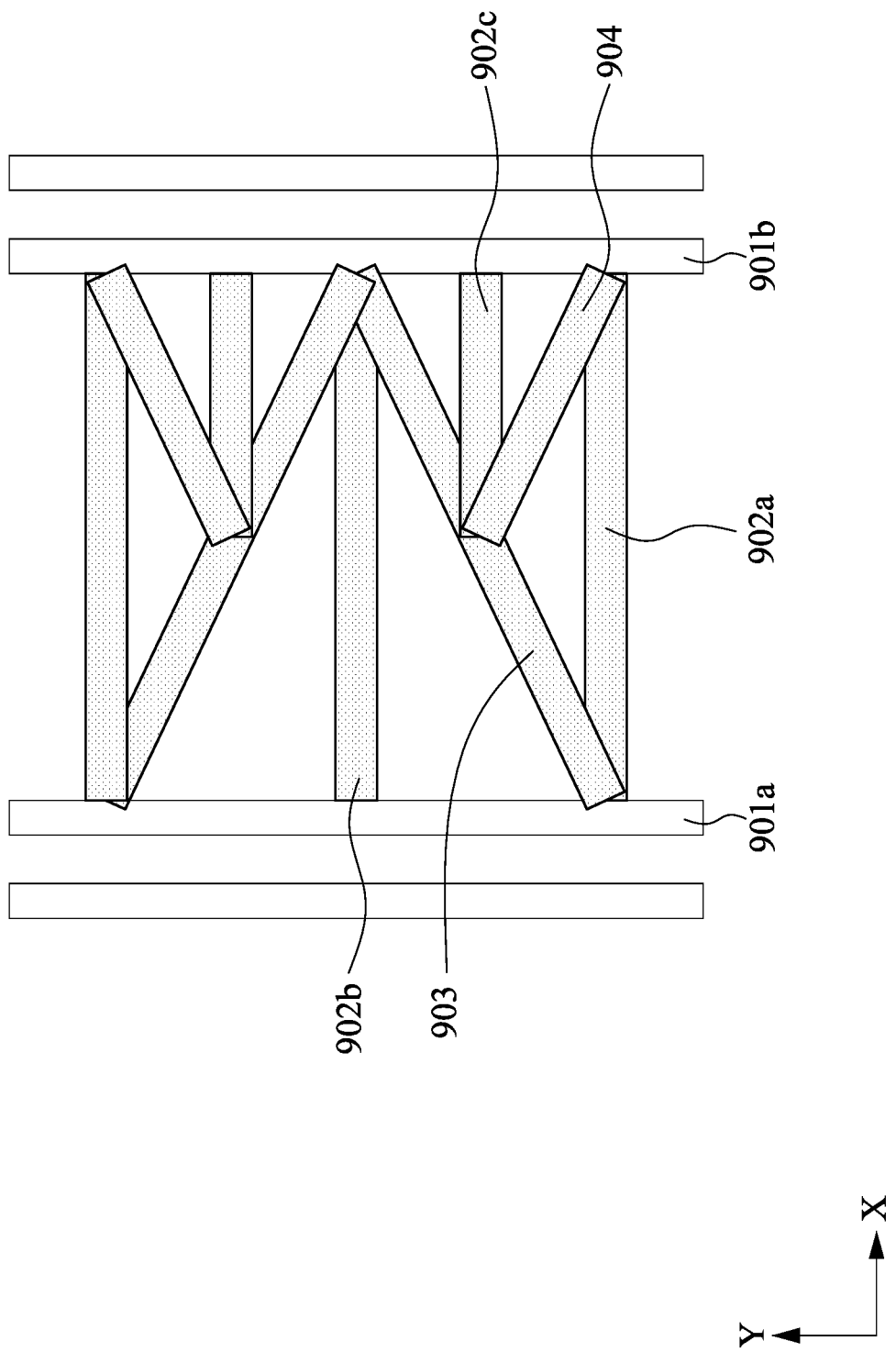
FIG. 9 illustrates an exemplary top view of a semiconductor structure, in accordance with some embodiments of the present disclosure.

FIG. 9 illustrates an exemplary top view of a semiconductor structure, in accordance with some embodiments of the present disclosure. A set of photoresist structures 901a and 901b are disposed along a Y-axis. The photoresist structures 901a and 901b are spaced apart.

A photoresist structure 902a is disposed along the X-axis. The photoresist structure 902a is disposed non-parallel to the Y-axis. The photoresist structure 902a is disposed orthogonal to the Y-axis. Another photoresist structure 902b is disposed along the X-axis. The photoresist structure 902b is disposed non-parallel to the Y-axis. The photoresist structure 902b is disposed orthogonal to the Y-axis. The photoresist structures 902a is disposed between the set of photoresist structures 901a and 901b. The photoresist structures 902*b* is disposed between the set of photoresist structures 901*a* and 901*b*. The photoresist structure 902*a* contacts the photoresist structure 901*a*. The photoresist structure 902*a* contacts the photoresist structure 901*b*. The photoresist structure 902*b* contacts the photoresist structure 901*a*. The photoresist structure 902*b* contacts the photoresist structure 901*b*.

The photoresist structures 902*a* and 902*b* are spaced apart. In some embodiments, a length of the photoresist structure 902*a* is substantially the same as that of the photoresist structure 902*b*. In some embodiments, a width of the photoresist structure 902*a* is substantially the same as that of the photoresist structure 902*b*. In other embodiments, the width of the photoresist structure 902*a* can be different than that of the photoresist structure 902*b*.

A photoresist structure 903 is disposed non-parallel to the photoresist structure 901*a*. The photoresist structure 903 is disposed non-parallel to the photoresist structure 901*b*. The photoresist structure 903 is disposed non-parallel to the photoresist structure 902*a*. The photoresist structure 903 is disposed non-parallel to the photoresist structure 902*b*. The photoresist structure 903 contacts the photoresist structure 901*a*. The photoresist structure 903 contacts the photoresist structure 901*b*. The photoresist structure 903 contacts the photoresist structure 902*a*. The photoresist structure 903 contacts the photoresist structure 902*b*.

A photoresist structure 904 is disposed non-parallel to the photoresist structure 901*a*. The photoresist structure 904 is disposed non-parallel to the photoresist structure 901*b*. The photoresist structure 904 is disposed non-parallel to the photoresist structure 902*a*. The photoresist structure 904 is disposed non-parallel to the photoresist structure 902*b*. The photoresist structure 904 is disposed non-parallel to the photoresist structure 903. The photoresist structure 904 contacts the photoresist structure 901*b*. The photoresist structure 904 contacts the photoresist structure 902*a*. The photoresist structure 904 contacts the photoresist structure 903. The photoresist structure 904 is spaced apart from the photoresist structure 901*a*.

A photoresist structure 902*c* is disposed non-parallel to the photoresist structure 901*a*. The photoresist structure 902*c* is disposed non-parallel to the photoresist structure 901*b*. The photoresist structure 902*c* is disposed parallel to the photoresist structure 902*a*. The photoresist structure 902*c* is disposed parallel to the photoresist structure 902*b*. The photoresist structure 902*c* is disposed non-parallel to the photoresist structure 903. The photoresist structure 902*c* is disposed non-parallel to the photoresist structure 904.

The photoresist structure 902*c* contacts the photoresist structure 901*b*. The photoresist structure 902*c* contacts the photoresist structure 903. The photoresist structure 902*c* contacts the photoresist structure 904. The photoresist structure 902*c* is spaced apart from the photoresist structure 901*a*. The photoresist structures 902*c*, 903, and 904 intersect at a point.

Figure 10:
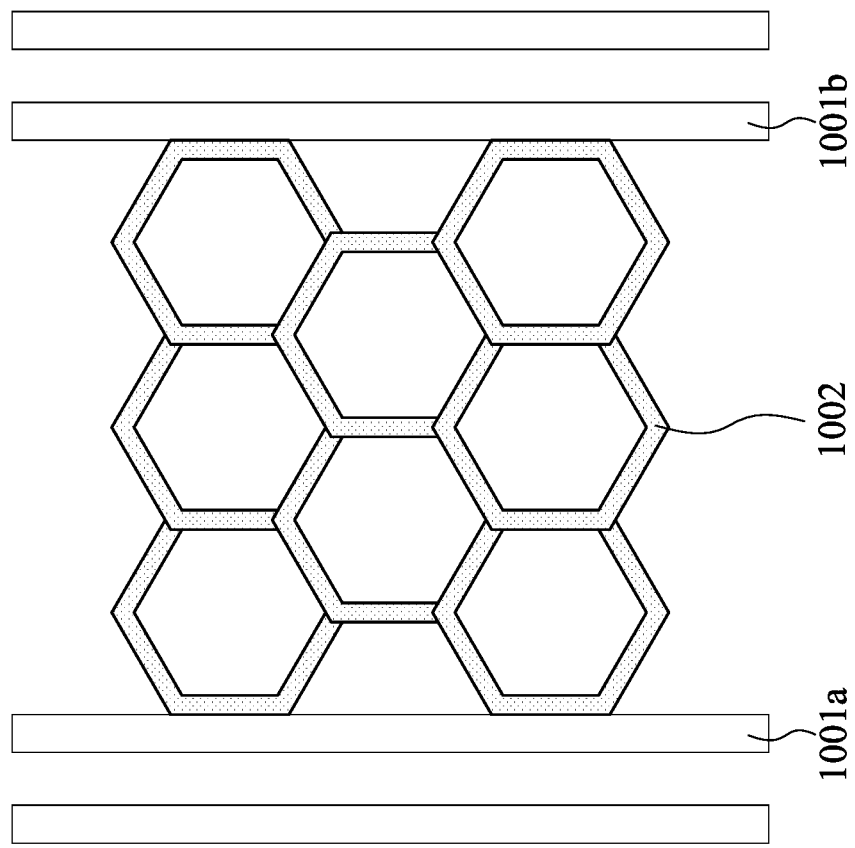
FIG. 10 illustrates an exemplary top view of a semiconductor structure, in accordance with some embodiments of the present disclosure.

FIG. 10 illustrates an exemplary top view of a semiconductor structure, in accordance with some embodiments of the present disclosure. A set of photoresist structures 1001*a* and 1001*b* are disposed along a Y-axis. The set of photoresist structures 1001*a* and 1001*b* are spaced apart.

A photoresist structure 1002 is disposed between the set of photoresist structures 1001*a* and 1001*b*. The photoresist structure 1002 contacts the photoresist structure 1001*a*. The photoresist structure 1002 contacts the photoresist structure 1001*b*. The photoresist structure 1002 is formed in a graphene configuration. The photoresist structure 1002 includes a plurality of hexagons. In other embodiments, the photoresist structure 1002 may include plurality of polygons.

Figure 11:
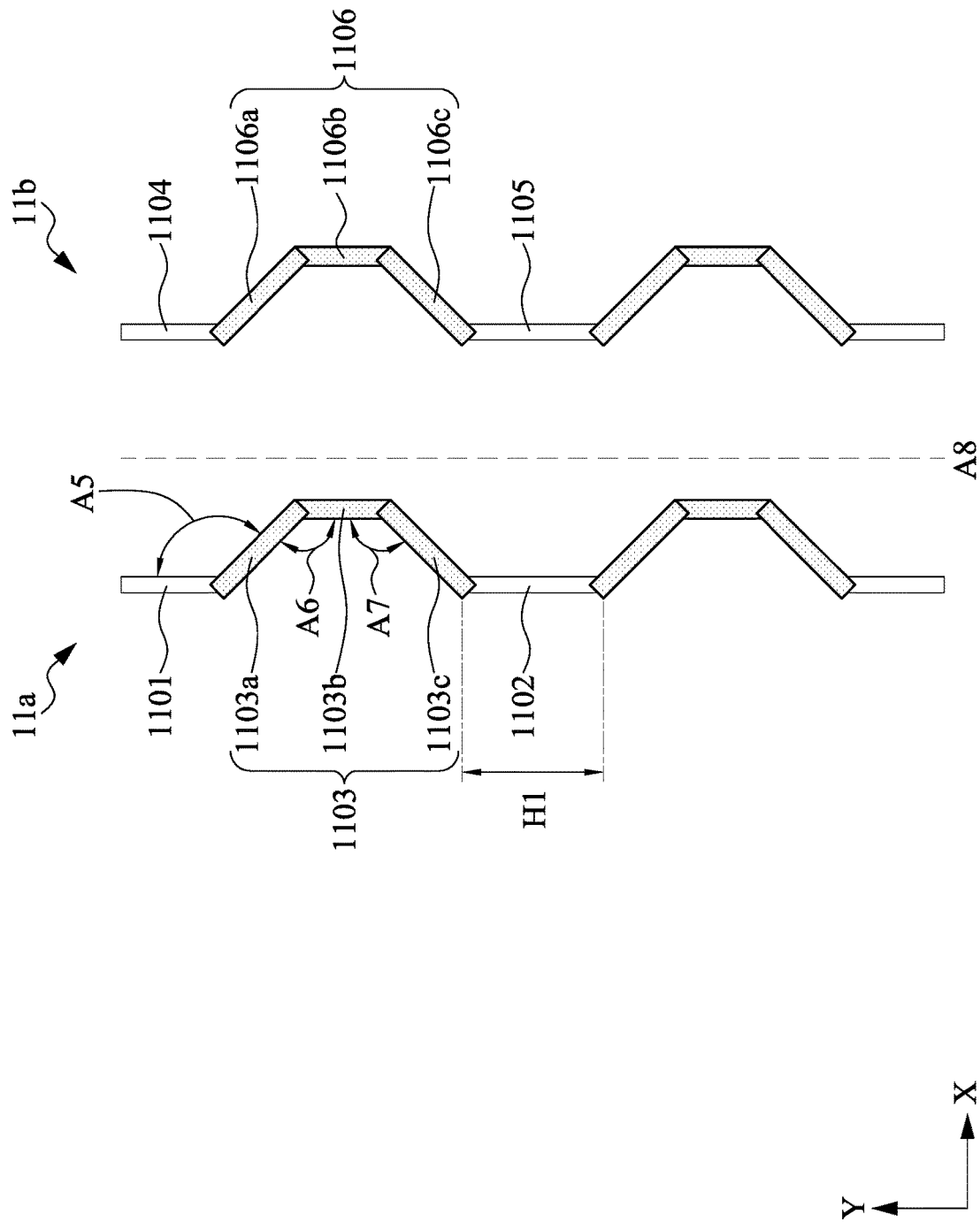
FIG. 11 illustrates an exemplary top view of a semiconductor structure, in accordance with some embodiments of the present disclosure.

FIG. 11 illustrates an exemplary top view of a semiconductor structure, in accordance with some embodiments of the present disclosure. Photoresist structures 11*a* and 11*b* are disposed along a Y-axis. The photoresist structure 11*a* includes photoresist structures 1101-1103. The photoresist structure 1101 is disposed along the Y-axis. The photoresist structure 1102 is disposed along the Y-axis. The photoresist structure 1103 is disposed between the photoresist structures 1101 and 1102. The photoresist structure 1103 includes portions 1103*a*, 1103*b*, and 1103*c*. The portion 1103*a* is disposed non-parallel to the Y-axis. The portion 1103*b* is disposed along the Y-axis. The portion 1103*c* is disposed non-parallel to the Y-axis.

The portion 1103*a* is disposed between the photoresist structure 1101 and the portion 1103*b*. The portion 1103*a* contacts the photoresist structure 1101 and the portion 1103*b*. An angle A5 between the photoresist structure 1101 and the portion 1103*a* is obtuse. In some embodiments, the angle A5 exceeds 90°. In some embodiments, the angle A5 is about 135°.

The portion 1103*b* is disposed between the portions 1103*a* and 1103*c*. The portion 1103*b* contacts the portions 1103*a* and 1103*c*. An angle A6 between the portions 1103*a* and 1103*b* is obtuse. In some embodiments, the angle A6 exceeds 90°. In some embodiments, the angle A6 is about 135°. In some embodiments, the angle A6 is the same as the angle A5.

The portion 1103*c* is disposed between the photoresist structure 1102 and the portion 1103*b*. The portion 1103*c* contacts the photoresist structure 1102 and the portion 1103*b*. An angle A7 between the portions 1103*b* and 1103*c* is obtuse. In some embodiments, the angle A7 exceeds 90°. In some embodiments, the angle A7 is about 135°. In some embodiments, the angle A7 is the same as angle A5. In some embodiments, the angle A7 is the same as angle A6. The lengths of the portions 1103*a*, 1103*b*, and 1103*c* are substantially the same. The portions 1103*a*, 1103*b*, and 1103*c* can evenly bear stress applied to the photoresist structure 1103.

In some embodiments, a length of the photoresist structure 1101 is substantially the same as that of the photoresist structure 1102. In some embodiments, the length of the photoresist structure 1102 is less than 3000 µm. A width of the photoresist structure 1101 is substantially the same as that of the photoresist structure 1102. A width of the photoresist structure 1101 is substantially the same as that of the photoresist structure 1103.

The photoresist structure 11*b* includes photoresist structures 1104-1106. The photoresist structure 1104 is disposed along a Y-axis. The photoresist structure 1105 is disposed along the Y-axis. The photoresist structure 1106 is disposed between the photoresist structures 1104 and 1105. The photoresist structure 1106 includes three portions 1106*a*, 1106*b*, and 1106*c*. The portion 1106*a* is disposed non-parallel to the Y-axis. The portion 1106*b* is disposed along the Y-axis. The portion 1106*c* is disposed non-parallel to the Y-axis.

The portion 1106*a* is disposed between the photoresist structure 1104 and the portion 1106*b*. The portion 1106*a* contacts the photoresist structure 1104 and the portion 1106*b*.

The portion 1106*b* is disposed between the portions 1106*a* and 1106*c*. The portion 1106*b* contacts the portions 1106*a* and 1106*c*.

The portion 1106c is disposed between the photoresist structure 1105 and the portion 1106b. The portion 1106c contacts the photoresist structure 1105 and the portion 1106b. The arrangement of the photoresist structures 1104, 1105 and 1106 are the same as that of the photoresist structures 1101, 1102 and 1103. The photoresist structures 1103 and 1106 are the same with respect to an axis A8. The axis A8 extends along the Y-axis. The axis A8 is located between the photoresist structures 1101 and 1104. The axis A8 is located between the photoresist structures 1102 and 1105. The axis A8 is located between the photoresist structures 1103 and 1106. The lengths of the portions 1106a, 1106b, and 1106c are substantially the same. If there is insufficient space to place dummy patterns of photoresist structures between the photoresist structures 11a and 11b, the shapes of the photoresist structures 1103 and 1106 may be changed to improve the reliability of the photoresist structures 11a and 11b.

If too long, the photoresist structures 11a may easily collapse. The arrangement of the portions 1103a, 1103b, and 1103c can evenly bear the stress applied to the photoresist structure 11a. Hence, the portions 1103a, 1103b, and 1103c can improve the reliability of the photoresist structure 11a.

If too long, the photoresist structures 11b may easily collapse. The arrangement of the portions 1106a, 1106b, and 1106c can evenly bear the stress applied to the photoresist structure 11b. Hence, the portions 1106a, 1106b, and 1106c can improve the reliability of the photoresist structures 11b. A detailed illustration of determining whether the photoresist structure is too long is shown in paragraphs regarding FIGS. 14A and 14B.

Figure 12:
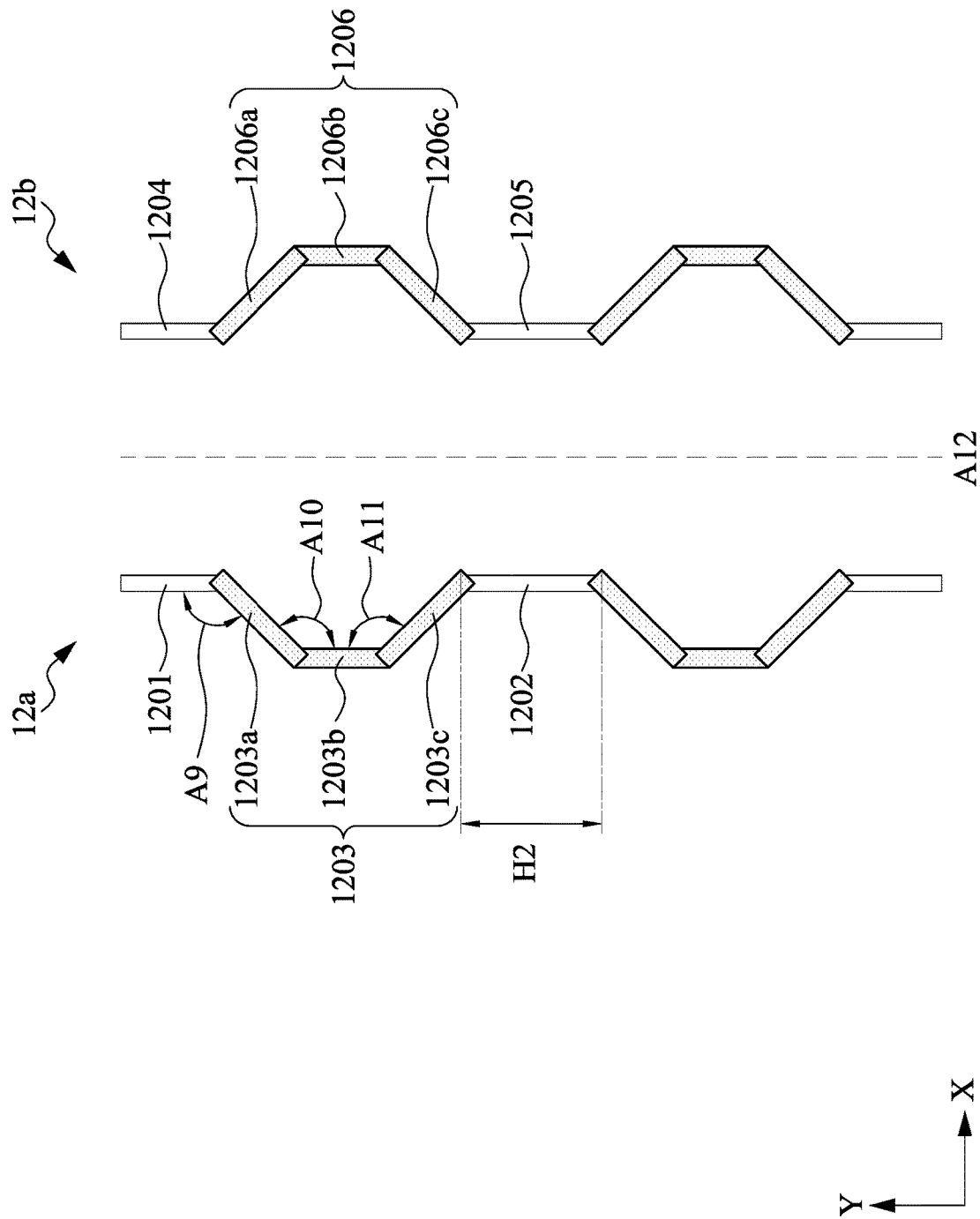
FIG. 12 illustrates an exemplary top view of a semiconductor structure, in accordance with some embodiments of the present disclosure.

FIG. 12 illustrates an exemplary top view of a semiconductor structure, in accordance with some embodiments of the present disclosure. A photoresist structure 1201 is disposed along a Y-axis. A photoresist structure 1202 is disposed along the Y-axis. A photoresist structure 1203 is disposed between the photoresist structures 1201 and 1202. The photoresist structure 1203 includes three portions 1203a, 1203b, and 1203c. The portion 1203a is disposed non-parallel to the Y-axis. The portion 1203b is disposed along the Y-axis. The portion 1203c is disposed non-parallel to the Y-axis.

The portion 1203a is disposed between the photoresist structure 1201 and the portion 1203b. The portion 1203a contacts the photoresist structure 1201 and the portion 1203b. An angle A9 between the photoresist structure 1201 and the portion 1203a is obtuse. In some embodiments, the angle A9 exceeds 90°. In some embodiments, the angle A9 is about 135°.

The portion 1203b is disposed between the portions 1203a and 1203c. The portion 1203b contacts the portions 1203a and 1203c. An angle A10 between the portions 1203a and 1203b is obtuse. In some embodiments, the angle A10 exceeds 90°. In some embodiments, the angle A10 is about 135°. In some embodiments, the angle A10 is the same as the angle A9.

The portion 1203c is disposed between the photoresist structure 1202 and the portion 1203b. The portion 1203c contacts the photoresist structure 1202 and the portion 1203b. An angle A11 between the portions 1203b and 1203c is obtuse. In some embodiments, the angle A11 exceeds 90°. In some embodiments, the angle A11 is about 135°. In some embodiments, the angle A11 is the same as the angle A9. In some embodiments, the angle A11 is the same as the angle A10. The lengths of the portions 1203a, 1203b, and 1203c are substantially the same. The portions 1203a, 1203b, and 1203c can evenly bear the stress applied to the photoresist structure 1203.

In some embodiments, a length of the photoresist structure 1201 is substantially the same as that of the photoresist structure 1202. In some embodiments, the length of the photoresist structure 1202 is less than 3000 μm. A width of the photoresist structure 1201 is substantially the same as that of the photoresist structure 1202. A width of the photoresist structure 1201 is substantially the same as that of the photoresist structure 1203.

A photoresist structure 1204 is disposed along the Y-axis. A photoresist structure 1205 is disposed along the Y-axis. A photoresist structure 1206 is disposed between the photoresist structures 1204 and 1205. The photoresist structure 1206 includes three portions 1206a, 1206b, and 1206c. The portion 1206a is disposed non-parallel to the Y-axis. The portion 1206b is disposed along the Y-axis. The portion 1206c is disposed non-parallel to the Y-axis.

The portion 1206a is disposed between the photoresist structure 1204 and the portion 1206b. The portion 1206a contacts the photoresist structure 1204 and the portion 1206b.

The portion 1206b is disposed between the portions 1206a and 1206c. The portion 1206b contacts the portions 1206a and 1206c.

The portion 1206c is disposed between the photoresist structure 1205 and the portion 1206b. The portion 1206c contacts the photoresist structure 1205 and the portion 1206b. The arrangement of the photoresist structures 1204, 1205 and 1206 are the same as that of the photoresist structures 1104, 1105 and 1106. The photoresist structures 1203 and 1206 are symmetrical with respect to an axis A12. The axis A12 extends along the Y-axis. The axis A12 is located between the photoresist structures 1201 and 1204. The axis A12 is located between the photoresist structures 1202 and 1205. The axis A12 is located between the photoresist structures 1203 and 1206. The portions 1206a, 1206b, and 1206c are substantially the same length. The portions 1206a, 1206b, and 1206c can evenly bear the stress applied to the photoresist structure 1206.

If too long, the photoresist structures 12a may easily collapse. The arrangement of the portions 1203a, 1203b, and 1203c can evenly bear the stress applied to the photoresist structure 12a. Hence, the portions 1203a, 1203b, and 1203c can improve the reliability of the photoresist structures 12a.

If too long, the photoresist structures 12b may easily collapse. The arrangement of the portions 1206a, 1206b, and 1206c can evenly bear the stress applied to the photoresist structure 12b. Hence, the portions 1206a, 1206b, and 1206c can improve the reliability of the photoresist structures 12b. A detailed illustration for determining whether the photoresist structure is too long is disclosed in paragraphs regarding FIGS. 14A and 14B.

Using the structural designs of the photoresist structures 11 and 12, the ratio of the length of the photoresist structure 11/12 divided by the width of the photoresist structure 11/12 is less than 500. This structural design can prevent the photoresist structures from collapsing and improve yield and reliability of manufacturing photoresist structures.

Figure 13:
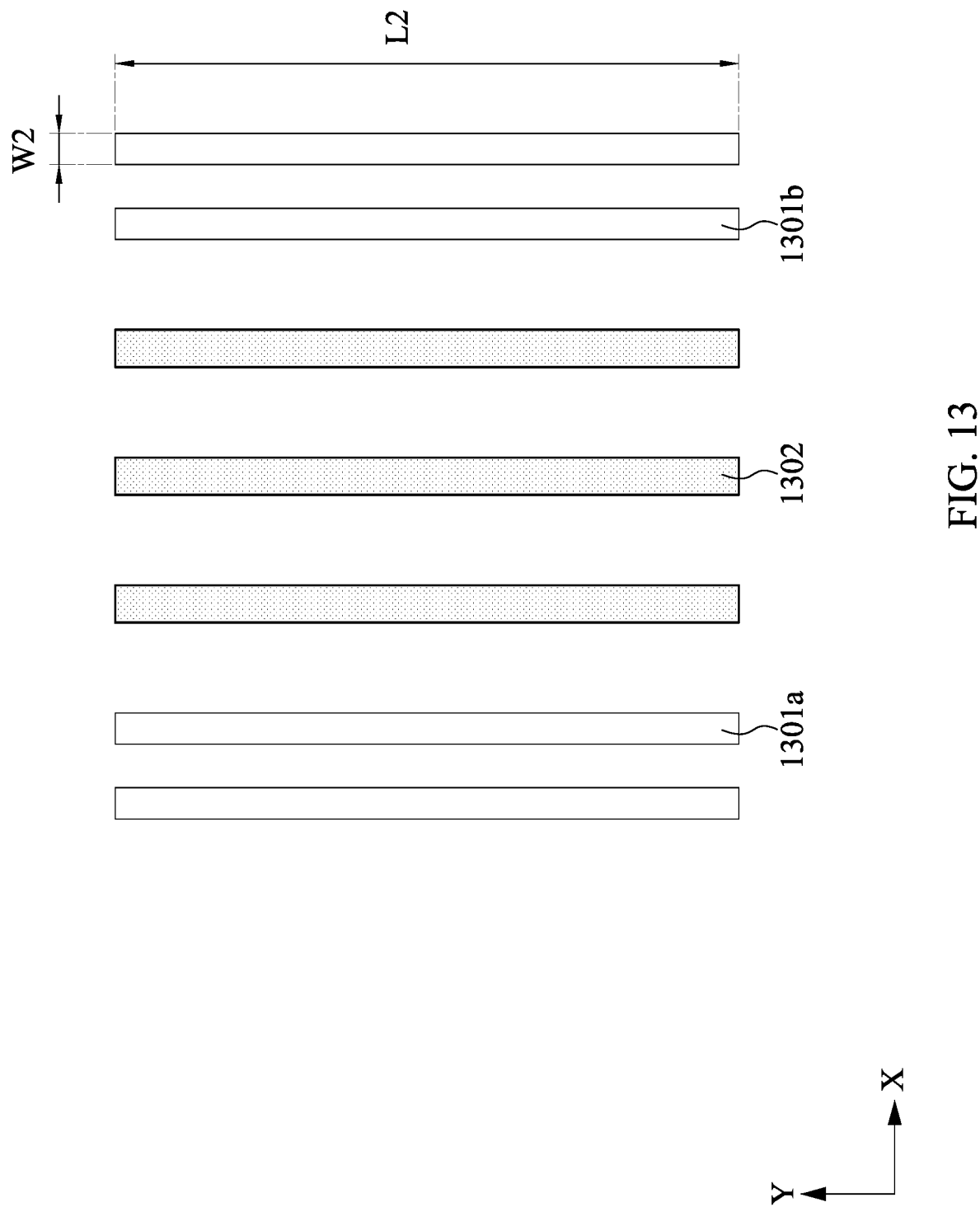
FIG. 13 illustrates an exemplary top view of a semiconductor structure, in accordance with some comparative embodiments of the present disclosure.

FIG. 13 illustrates an exemplary top view of a semiconductor structure, in accordance with some comparative embodiments of the present disclosure. A set of photoresist structures 1301a is disposed along a Y-axis. A set of photoresist structures 1301b is disposed along the Y-axis. Each of the set of photoresist structures 1301a is spaced apart. Each of the set of photoresist structures 1301b is spaced apart.

The photoresist structures 1302 is disposed between the photoresist structures 1301a and 1301b. The photoresist structures 1302 separate the photoresist structures 1301a and 1301b. The photoresist structure 1302 is spaced apart from the set of photoresist structures 1301a. The photoresist structure 1302 is spaced apart from the set of photoresist structures 1301b.

Length L2 of the photoresist structure 1301a is substantially the same as that of the photoresist structure 1301b. Width W2 of the photoresist structure 1301a is substantially the same as that of the photoresist structure 1301b. The length L2 of the photoresist structure 1301a is substantially the same as that of the photoresist structure 1302. The width W2 of the photoresist structure 1301a is substantially the same as that of the photoresist structure 1302.

Figure 14A:
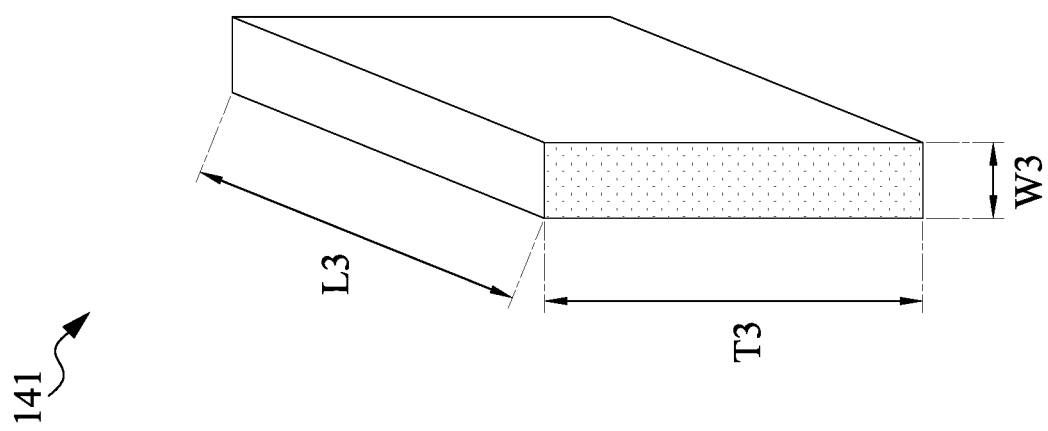
FIG. 14A illustrates an exemplary stereogram of a photoresist structure, in accordance with some embodiments of the present disclosure.

FIG. 14A illustrates an exemplary stereogram of a straight photoresist structure 141, in accordance with some embodiments of the present disclosure. The photoresist structure 141 has a length L3, a width W3, and a thickness T3. In some embodiments, the width W3 is in a range of 18 nm to 60000 nm. In some embodiments, the thickness T3 is in a range of 30 nm to 50000 nm. In some embodiments, a ratio of the length to width (L3/W3) of the photoresist structure 141 is less than 500.

Figure 14B:
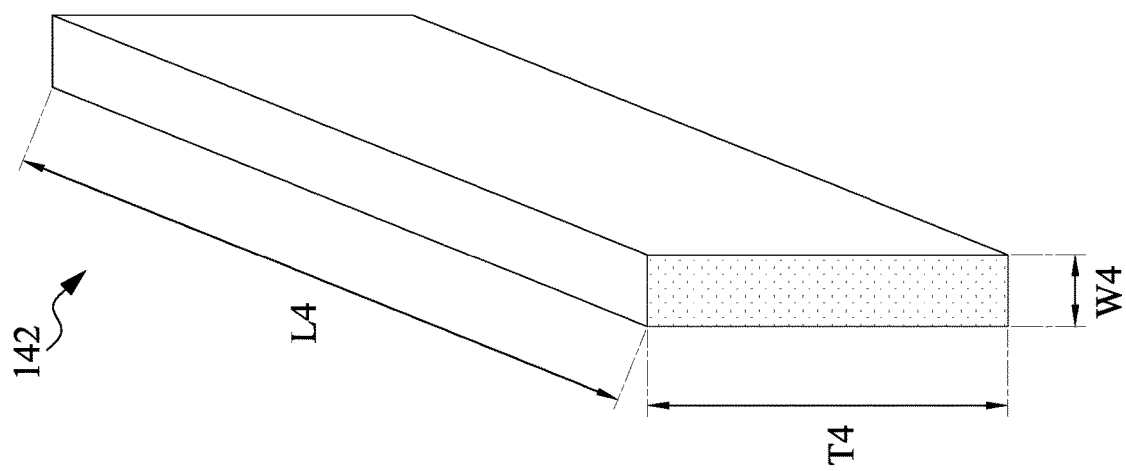
FIG. 14B illustrates an exemplary stereogram of a photoresist structure, in accordance with some embodiments of the present disclosure.

FIG. 14B illustrates an exemplary stereogram of a straight photoresist structure 142, in accordance with some embodiments of the present disclosure. The photoresist structure 142 has a length L4, a width W4, and a thickness T4. In some embodiments, the width W4 is in a range of 18 nm to 60000 nm. In some embodiments, the thickness T4 is in a range of 30 nm to 50000 nm. In some embodiments, a ratio of the length to width (L4/W4) of the straight photoresist structure 142 exceeds 500. When the ratio of the length and width of a straight photoresist structure exceeds 500, the straight photoresist structure may collapse or overlap with its adjacent photoresist structure easily.

Figure 15:
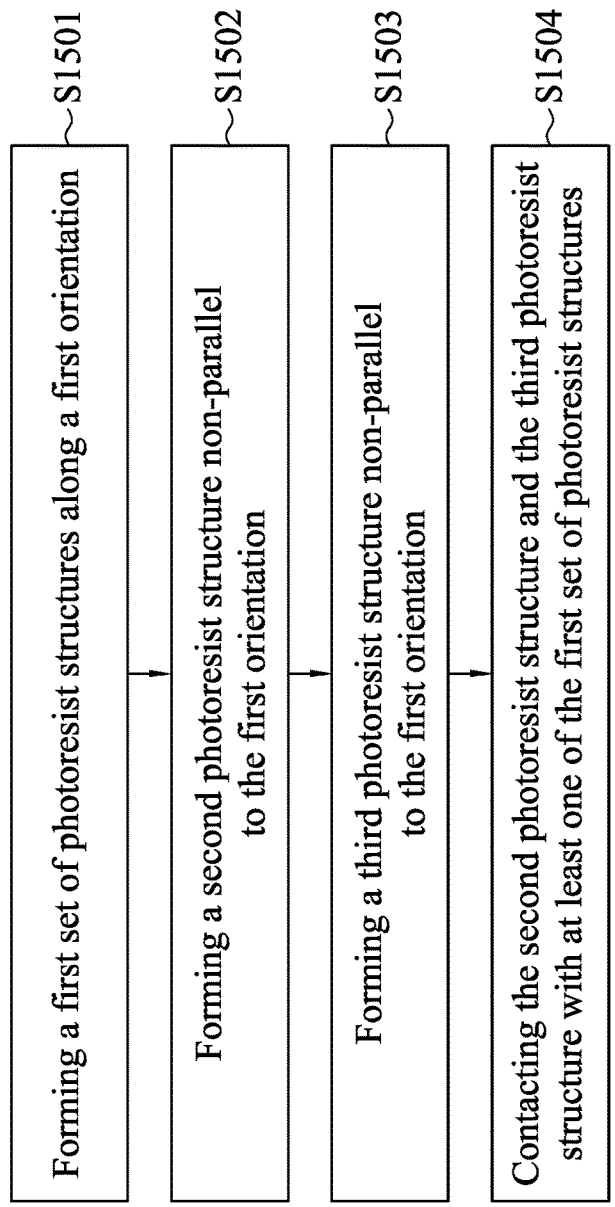
FIG. 15 is a flowchart illustrating a method for manufacturing a semiconductor structure, in accordance with various aspects of the present disclosure.

FIG. 15 is a flowchart illustrating a method for manufacturing a semiconductor structure, in accordance with various aspects of the present disclosure.

The method 1500 includes operation S1501. In operation S1501, a first set of photoresist structures is formed along a first orientation. For example, the set of photoresist structures 101a and 101b are formed along a Y-axis, as shown in FIG. 1.

The method 1500 includes operation S1502. In operation S1502, a second photoresist structure is formed non-parallel to the first orientation. For example, a photoresist structure 102a is formed non-parallel to the Y-axis, as shown in FIG. 1.

The method 1500 includes operation S1503. In operation S1503, a third photoresist structure is formed non-parallel to the first orientation. For example, a photoresist structure 102b is formed non-parallel to the Y-axis, as shown in FIG. 1.

The method 1500 includes operation S1504. In operation S1504, the second photoresist structure and the third photoresist structure contact with at least one of the first set of photoresist structures. For example, the photoresist structures 102a and 102b contact at least one of the set of photoresist structures 101a and 101b, as shown in FIG. 1.

In some embodiments, the second photoresist structure is formed orthogonal to the first set of photoresist structures. For example, the photoresist structure 102a is formed orthogonal to the set of photoresist structures 101a and 101b, as shown in FIG. 1. In some embodiments, a fourth photoresist structure is formed in the first orientation and in contact with the second photoresist structure and the third photoresist structure. For example, a photoresist structure 203 can be formed along the Y-axis and in contact with the photoresist structures 202a and 202b, as shown in FIG. 2.

The method 1500 is merely an example, and is not intended to limit the present disclosure beyond what is explicitly recited in the claims. Additional operations can be provided before, during, or after each operation of the method 700, and some operations described can be replaced, eliminated, or reordered for additional embodiments of the method. In some embodiments, the method 1500 can include further operations not depicted in FIG. 15.

Some embodiments of the present disclosure provide a semiconductor structure. The semiconductor structure includes a first set of photoresist structures, a second photoresist structure, and a third photoresist structure. The first set of photoresist structures are disposed along a first orientation. The second photoresist structure is disposed non-parallel to the first orientation. The third photoresist structure is disposed non-parallel to the first orientation. The second photoresist structure and the third photoresist structure contact at least one of the first set of photoresist structures.

Some embodiments of the present disclosure provide a semiconductor device. The semiconductor structure includes a first photoresist structure, a second photoresist structure, and a third photoresist structure. The first photoresist structure is disposed along a first orientation. The second photoresist structure is disposed along the first orientation e third photoresist structure is disposed between the first and second photoresist structures. The third photoresist structure comprises first, second and third portions. An angle between the first photoresist structure and the first portion of the second photoresist structure is obtuse.

Some embodiments of the present disclosure provide a method of manufacturing a semiconductor structure. The method comprises forming a first set of photoresist structures along a first orientation, forming a second photoresist structure non-parallel to the first orientation, forming a third photoresist structure non-parallel to the first orientation, and contacting the second photoresist structure and the third photoresist structure with at least one of the first set of photoresist structures.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
  a first set of photoresist structures disposed along a first orientation;
  a second photoresist structure disposed non-parallel to the first orientation; and
  a third photoresist structure disposed non-parallel to the first orientation, wherein the second photoresist structure and the third photoresist structure contact at least one of the first set of photoresist structures, and two ends of at least one of the second photoresist structure and the third photoresist structure contact the first set of photoresist structures.

2. The semiconductor structure of claim 1, wherein the second photoresist structure and the third photoresist structure are orthogonal to the first orientation.

3. The semiconductor structure of claim 2, further comprising a fourth photoresist structure disposed along the first orientation and in contact with the second photoresist structure and the third photoresist structure.

4. The semiconductor structure of claim 1, wherein the second photoresist structure and the third photoresist structure intersect.

5. The semiconductor structure of claim 4, further comprising a fourth photoresist structure disposed orthogonal to the first orientation.

6. The semiconductor structure of claim 5, wherein the fourth photoresist structure is disposed at the intersection of the second photoresist structure and the third photoresist structure.

7. The semiconductor structure of claim 4, wherein an angle between the first set of photoresist structures and the second photoresist structure is acute.

8. The semiconductor structure of claim 1, wherein the second photoresist structure and the third photoresist structure contact with each other.

9. The semiconductor structure of claim 8, further comprising a fourth photoresist structure disposed orthogonal to the first orientation.

10. The semiconductor structure of claim 9, wherein the fourth photoresist structure contacts with the first set of photoresist structures.

11. The semiconductor structure of claim 1, further comprising
a fourth photoresist structure disposed non-parallel to the first set of photoresist structures, the second photoresist structure and the third photoresist structure; and
a fifth photoresist structure disposed non-parallel to the first set of photoresist structures, the second photoresist structure, the third photoresist structure, and the fourth photoresist structure.

12. The semiconductor structure of claim 11, wherein the fifth photoresist structure contacts with the second photoresist structure and the fourth photoresist structure.

13. A method of manufacturing a semiconductor structure, comprising:
forming a first set of photoresist structures along a first orientation;
forming a second photoresist structure non-parallel to the first orientation;
forming a third photoresist structure non-parallel to the first orientation; and
contacting the second photoresist structure and the third photoresist structure with at least one of the first set of photoresist structures, wherein two ends of at least one of the second photoresist structure and the third photoresist structure contact the first set of photoresist structures.

14. The method of claim 13, wherein the second photoresist structure is formed orthogonal to the first set of photoresist structures.

15. The method of claim 13, further comprising forming a fourth photoresist structure along the first orientation and in contact with the second photoresist structure and the third photoresist structure.

16. A semiconductor structure, comprising:
a first set of photoresist structures disposed along a first orientation;
a second photoresist structure disposed orthogonal to the first orientation; and
a third photoresist structure disposed non-parallel to the first orientation, wherein
the second photoresist structure and the third photoresist structure contact with at least one of the first set of photoresist structures, and two ends of at least one of the second photoresist structure and the third photoresist structure contact the first set of photoresist structures.

17. The semiconductor structure of claim 16, further comprising a fourth photoresist structure disposed non-parallel to the first orientation.

18. The semiconductor structure of claim 17, wherein the third photoresist structure is non-parallel to the fourth photoresist structure.

19. The semiconductor structure of claim 17, further comprising a fifth photoresist structure disposed non-parallel to the first orientation.

20. The semiconductor structure of claim 19, wherein the fifth photoresist structure contacts the third and fourth photoresist structures.

* * * * *